(12) United States Patent
Hayashi et al.

(10) Patent No.: US 7,261,998 B2
(45) Date of Patent: *Aug. 28, 2007

(54) IMAGEABLE ELEMENT WITH SOLVENT-RESISTANT POLYMERIC BINDER

(75) Inventors: Kouji Hayashi, Tatebayashi (JP); Heidi M. Munnelly, Windsor, CO (US); Ting Tao, Fort Collins, CO (US); Jianbing Huang, Trumbull, CT (US); Shashikant Saraiya, Fort Collins, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/872,209

(22) Filed: Jun. 17, 2004

(65) Prior Publication Data

US 2005/0003285 A1 Jan. 6, 2005

Related U.S. Application Data

(63) Continuation-in-part of application No. 10/842,111, filed on May 10, 2004, and a continuation-in-part of application No. 10/813,221, filed on Mar. 30, 2004, and a continuation-in-part of application No. 10/119,454, filed on Apr. 10, 2002, now Pat. No. 6,899,994, which is a continuation-in-part of application No. 09/826,300, filed on Apr. 4, 2001, now Pat. No. 6,582,882.

(51) Int. Cl.
G03C 1/77 (2006.01)
G03F 7/028 (2006.01)
G03F 7/033 (2006.01)
G03F 7/038 (2006.01)
G03F 7/20 (2006.01)

(52) U.S. Cl. ............... 430/271.1; 430/302; 430/278.1; 430/281.1; 430/285.1; 430/286.1; 430/287.1; 430/905; 430/910; 430/916; 430/920; 430/944

(58) Field of Classification Search ............... None
See application file for complete search history.

(56) References Cited

U.S. PATENT DOCUMENTS

| | | |
|---|---|---|
| 4,565,769 A | 1/1986 | Dueber et al. |
| 4,973,572 A | 11/1990 | DeBoer |
| 4,997,745 A | 3/1991 | Kawamura et al. |
| 5,075,192 A | 12/1991 | Fryd et al. |
| 5,107,063 A | 4/1992 | West et al. |
| 5,208,135 A | 5/1993 | Patel et al. |
| 5,242,779 A | 9/1993 | Mueller-Hess et al. |
| 5,330,884 A | 7/1994 | Fabricius |
| 5,368,990 A | 11/1994 | Kawabata et al. |
| 5,496,903 A | 3/1996 | Watanabe et al. |
| 5,599,650 A | 2/1997 | Bi et al. |
| 5,609,980 A | 3/1997 | Matthews et al. |
| 5,616,449 A | 4/1997 | Cheng et al. |
| 5,811,220 A | 9/1998 | Cheng et al. |
| 5,928,833 A | 7/1999 | Matthews et al. |
| 5,942,372 A | 8/1999 | West et al. |
| 5,972,838 A | 10/1999 | Pearce et al. |
| 6,017,673 A | 1/2000 | Vanmaele et al. |
| 6,071,675 A | 6/2000 | Teng |
| 6,187,502 B1 | 2/2001 | Chapman et al. |
| 6,245,483 B1 | 6/2001 | Oshimo et al. |
| 6,294,311 B1 | 9/2001 | Shimazu et al. |
| 6,309,792 B1 | 10/2001 | Hauck et al. |
| 6,326,122 B1 | 12/2001 | Nagasaka et al. |
| 6,489,078 B1 | 12/2002 | Damme et al. |
| 6,550,387 B1 | 4/2003 | Vermeersch et al. |
| 6,566,029 B2 | 5/2003 | Kawamura et al. |
| 6,582,882 B2 | 6/2003 | Pappas et al. |
| 6,641,976 B2 | 11/2003 | Vermeersch et al. |
| 6,653,042 B1 | 11/2003 | Fukino et al. |
| 2001/0021750 A1 | 9/2001 | Utsunomiya et al. |
| 2002/0197564 A1 | 12/2002 | Timpe et al. |
| 2003/0064318 A1 | 4/2003 | Huang et al. |
| 2003/0073033 A1 | 4/2003 | Kawamura et al. |
| 2003/0075066 A1 | 4/2003 | Tan et al. |
| 2003/0129520 A1 | 7/2003 | Oohashi et al. |
| 2003/0157433 A1 | 8/2003 | Timpe et al. |
| 2003/0194648 A1* | 10/2003 | Murota et al. ........... 430/278.1 |
| 2004/0013968 A1 | 1/2004 | Teng |
| 2004/0091811 A1 | 5/2004 | Munnelly et al. |
| 2005/0250040 A1* | 11/2005 | Tao et al. ................ 430/270.1 |

FOREIGN PATENT DOCUMENTS

| | | |
|---|---|---|
| EP | 0 514 145 A1 | 11/1992 |
| EP | 0 823 327 | 2/1998 |
| EP | 1 117 005 A1 | 7/2001 |
| EP | 1 234 662 | 8/2002 |
| WO | WO 03/087939 | 10/2003 |

OTHER PUBLICATIONS

U.S. Appl. No. 10/842,111, filed May 10, 2004, Tao et al.
U.S. Appl. No. 10/847,708, filed May 17, 2004, Munnelly et al.
"Glossary of Basic Terms in Polymer Science", published by International Union of Pure and Applied Chemistry (IUPAC), *Pure Appl. Chem.* 68, 2287-2311 (1996).

* cited by examiner

*Primary Examiner*—Sin Lee
(74) *Attorney, Agent, or Firm*—J. Lanny Tucker

(57) ABSTRACT

The present invention provides an imageable element including a lithographic substrate and an imageable layer disposed on the substrate. The imageable layer includes a radically polymerizable component, an initiator system capable of generating radicals sufficient to initiate a polymerization reaction upon exposure to imaging radiation, and a polymeric binder having a hydrophobic backbone and including both constitutional units having a pendant cyano group attached directly to the hydrophobic backbone, and constitutional units having a pendant group including a hydrophilic poly(alkylene oxide) segment. When the imageable element is imaged and developed, the resulting printing plate may exhibit improved on-press solvent resistance and longer press life.

43 Claims, No Drawings

IMAGEABLE ELEMENT WITH SOLVENT-RESISTANT POLYMERIC BINDER

REFERENCE TO RELATED APPLICATION

This application is a continuation-in-part of U.S. patent application Ser. No. 10/842,111 filed May 10, 2004, and entitled "On-Press Developable Imageable Element," the disclosure of which is incorporated herein by reference in its entirety. This application is a continuation-in-part of U.S. patent application Ser. No. 10/813,221 filed Mar. 30, 2004, the disclosure of which is incorporated herein by reference in its entirety. This application is a continuation-in-part of U.S. patent application Ser. No. 10/119,454 filed Apr. 10, 2002 now U.S. Pat. No. 6,899,994, which is a continuation-in-part of U.S. patent application Ser. No. 09/826,300 filed Apr. 4, 2001 (now U.S. Pat. No. 6,582,882), the disclosure of each of which is incorporated herein by reference in its entirety.

TECHNICAL FIELD

The present invention relates to imageable elements useful as lithographic printing plate precursors. In conventional or "wet" lithographic printing, ink-receptive regions, known as image areas, are generated on a hydrophilic surface of a lithographic substrate to produce a printing plate. When the surface of the printing plate is moistened with water and ink is applied, the hydrophilic regions retain water and repel ink, and the ink-receptive regions accept ink and repel water. The ink is transferred to the surface of a medium upon which the image is to be reproduced. Typically, the ink is first transferred to an intermediate blanket, which in turn transfers the ink to the surface of the medium upon which the image is to be reproduced.

Imageable elements useful as precursors for lithographic printing plates typically comprise an imageable layer applied over the hydrophilic surface of a substrate. The imageable layer includes one or more radiation-sensitive components, often dispersed in a suitable binder. Following imagewise exposure, either the exposed regions or the unexposed regions of the imageable layer are removed by a suitable developer, revealing the underlying hydrophilic surface of the substrate. If the exposed regions are removed, the precursor is positive-working. Conversely, if the unexposed regions are removed, the precursor is negative-working. In each instance, the regions of the imageable layer (i.e., the image areas) that remain are ink-receptive, and the regions of the hydrophilic surface revealed by the developing process accept water and aqueous solutions, typically a fountain solution, and do not accept ink.

Conventional imaging of the imageable element with ultraviolet and/or visible imaging radiation can be carried out through a mask having transparent and opaque regions. The mask is placed in direct contact with the imageable element, and ultraviolet imaging radiation is directed through the mask. The regions of the imageable element under the transparent regions of the mask are exposed, while the regions under the opaque regions of the mask are unexposed.

However, direct digital imaging, which obviates the need for imaging through a mask, is becoming increasingly prevalent in the printing industry. In particular, imageable elements for the preparation of lithographic printing plates have been developed for imaging with infrared lasers. High-performance lasers or laser diodes which are used in commercially available image-setters generally emit light in the wavelength ranges of between 800 to 850 nm or between 1060 and 1120 nm. Such a laser beam can be digitally controlled via a computer; i.e. the laser can be turned on or off so that an imagewise exposure of the precursor can be effected via stored digitized information in the computer.

Therefore, printing plate precursors, or initiator systems contained therein, which are to be imagewise exposed by means of such image-setters need to be sensitive in the near-infrared region of the spectrum. Such printing plate precursors can then be handled under daylight conditions which significantly facilitates their production and processing.

Imaged elements typically require processing in a developer to convert them to lithographic printing plates. Developers are typically aqueous alkaline solutions, which may also contain substantial amounts of organic solvents. Because of high pH and the presence of organic solvents, disposal of substantial quantities of used developer is expensive and can cause environmental problems. Processing of the imaged element in a developer also introduces additional costs in the cost of the developer, the cost of the processing equipment, and the labor costs for operating the process.

On-press developable lithographic printing plate precursors can be directly mounted on a press after imaging, and are developed through contact with ink and/or fountain solution during the initial press operation. Such precursors do not require a separate development step before mounting on press. On-press imaging, in which the precursor is both imaged and developed on press, eliminates the need to mount the precursor in a separate imaging device.

SUMMARY OF THE INVENTION

The present invention relates to a negative-working imageable element including a photosensitive coating comprising a polymeric binder having pendant cyano groups and pendant groups including a poly(alkylene oxide) segment. After exposure, the imaged element can be mounted directly on press, without an intermediate development step. Inclusion of the binder into the imageable layer enhances the on-press solvent resistance of the resulting printing plate. As a result, the printing plate may exhibit a longer press life. In some embodiments, the imageable element can be both imaged and developed on-press.

In one embodiment, the present invention provides an imageable element including a lithographic substrate and an imageable layer disposed on the substrate. The imageable layer includes a radically polymerizable component, an initiator system capable of generating radicals sufficient to initiate a polymerization reaction upon exposure to imaging radiation, and a polymeric binder having a hydrophobic backbone and including both constitutional units having a pendant cyano group attached directly to the hydrophobic backbone, and constitutional units having a pendant group including a hydrophilic poly(alkylene oxide) segment.

DETAILED DESCRIPTION OF THE INVENTION

Unless the context indicates otherwise, in the specification and claims, the terms photothermal conversion material, copolymer, co-binder, monomer and co-monomer, macromer, and similar terms also include mixtures and combinations of such materials. Unless otherwise specified, all percentages are percentages by weight.

For clarification of definitions for any terms relating to polymers, please refer to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

On-press imageable elements are known in the art. For example, U.S. Pat. No. 6,582,882 to Pappas, et al. reports a thermally imageable composition comprising a copolymer having polyethylene oxide side chains. This reference does not, however, report a composition comprising polymerizable components or initiators.

Co-pending U.S. patent application Ser. No. 10/066,874 (U.S. Pub. App. 2003/0157433) of Timpe, et al. (the disclosure of which is incorporated herein by reference in its entirety) reports an infrared-sensitive composition comprising a first polymeric binder which does not comprise acidic groups, a second polymeric binder comprising polyether groups, an initiator system, and a free radical polymerizable system. The second binder can be a polyalkylene ether polymer or copolymer, such as a block copolymer of polyethylene oxide and polypropylene oxide.

Co-pending U.S. patent application Ser. No. 10/119,454 (U.S. Pub. App. 2003/0064318) of Huang, et al. reports a polymerizable coating composition comprising a polymerizable compound and a polymeric binder comprising polyethylene oxide segments. The binder can be a block copolymer having a polyethylene oxide block, or a graft copolymer having polyethylene oxide side chains.

The present invention provides a novel imageable element including a lithographic substrate and an imageable layer disposed on the substrate. The imageable layer includes a radically polymerizable component, an initiator system capable of generating radicals sufficient to initiate a polymerization reaction upon exposure to imaging radiation, and a polymeric binder having a hydrophobic backbone and including both constitutional units having a pendant cyano group attached directly to the hydrophobic backbone, and constitutional units having a pendant group including a hydrophilic poly(alkylene oxide) segment.

Imageable Element

The imageable element includes an imageable layer disposed on a lithographic substrate. The imageable element is negative-working. The imageable layer includes a polymerizable component, an initiator system, and a polymeric binder. The lithographic substrate and imageable layer are described further below.

In some embodiments, no layers other than the imageable layer are utilized in the imageable element. However, in other embodiments the imageable element may further include an overlying layer. One possible function of the overlying layer is to serve as an oxygen barrier layer that prevents the diffusion of oxygen from the atmosphere into the imageable layer. The overlying layer should be soluble, dispersible in, or at least swellable by or permeable to the developer. Other possible functions of an overlying layer include: to prevent damage, such as scratching, of the surface layer during handling prior to imagewise exposure; to prevent damage to the surface of the imagewise exposed areas, for example, by over-exposure which could result in partial ablation; and to facilitate developability of the unexposed areas.

In some embodiments, the imageable element can include a layer underlying the imageable layer. Possible functions of an underlying layer include: to enhance developability of the imagewise unexposed areas; and to act as a thermal insulating layer for the imagewise exposed areas. Such a thermal insulating polymeric layer prevents otherwise rapid heat dissipation, for example, through a heat-conducting substrate. In accordance with these functions, the underlying layer should be soluble or at least dispersible in the developer and, preferably, have relatively low thermal conductivity.

Lithographic Substrate

The lithographic substrate acts as a support, and may be any material conventionally used for the preparation of lithographic printing plates. In general, a suitable lithographic substrate will have a hydrophilic surface on which the imageable layer is disposed.

The substrate material should be strong, stable, and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Suitable metal materials include, for example, aluminum, zinc, titanium, and alloys thereof. The back side of the lithographic substrate (i.e., the side opposite the imageable layer) may be coated with an antistatic agent and/or a slipping layer or matte layer to improve handling and "feel" of the imageable element.

Typically, when the substrate material is a polymeric film, it will contain a sub-coating on one or both surfaces to modify the surface characteristics. For example, the polymeric film may be coated to enhance the hydrophilicity of the surface, to improve adhesion to overlying layers, to improve planarity of paper substrates, and the like. The nature of this coating depends upon the substrate and the composition of subsequent layers. Examples of subbing materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

One particularly suitable lithographic substrate is a hydrophilic aluminum substrate. Generally an aluminum support will be surface-treated by techniques known in the art, including physical graining, electrochemical graining, chemical graining, and anodizing. If the surface is roughened, the average roughness (Ra) is preferably in the range from 0.1 to 0.8 µm, and more preferably in the range from about 0.1 to about 0.4 µm.

Conventional anodization techniques include sulfuric acid anodization and phosphoric acid anodization, for example. Anodic pore size for sulfuric acid anodization is typically less than 20 nm whereas anodic pore size for phosphoric acid anodization is typically greater than 30 nm. The use of large anodic pore substrates that are phosphoric acid anodized is preferred over sulfuric acid-anodized substrates. Other conventional anodization methods can also be used in the preparation of the anodized substrate of the present invention, including particularly those that produce an anodic pore size larger than anodic pore size produced by sulfuric acid anodization.

The substrate should be of sufficient thickness to sustain wear from printing and be thin enough to wrap around a cylinder in a printing press, typically about 100 µm to about 600 µm. An aluminum lithographic substrate may comprise an interlayer between the aluminum support and any overlying layers. The interlayer may be formed by treatment of the aluminum support with, for example, silicate, dextrine, hexafluorosilicic acid, phosphate/fluoride, poly(acrylic acid) (PAA), poly(vinyl phosphonic acid) (PVPA), vinyl phosphonic acid co-polymers, or a water-soluble diazo resin.

Imageable Layer

The imageable layer comprises a polymerizable composition including a polymerizable component, an initiator system, and a polymeric binder. The polymerizable composition typically comprises about 10 wt.-% to about 70 wt.-%, more suitably about 20 wt.-% to about 60 wt.-%, and most suitably about 30 wt.-% to about 50 wt.-% of the polymerizable component. The polymerizable composition also includes about 10 wt.-% to about 80 wt.-%, more suitably about 20 wt.-% to about 50 wt.-%, and most suitably about 30 wt.-% to about 40 wt.-% of binder. The polymerizable composition further includes about 0.01 wt.-% to about 20 wt.-%, more suitably about 0.1 wt.-% to about 10 wt.-%, of the initiator system.

Other conventional ingredients, such as surfactants and contrast dyes, may be included in the polymerizable composition. The polymerizable composition may optionally include up to 20 wt.-%, more suitably about 0 wt.-% to about 5 wt.-%, of other ingredients.

By way of example, an additive for extending shelf life of the imageable layer may be included. Examples of additives that may be effective for extending shelf life include mercapto compounds, amino compounds, and monocarboxylic or polycarboxylic acids. Suitable mercapto compounds are described in co-pending U.S. patent application Ser. No. 10/131,866 (U.S. Pub. App. 2002/0197564) of Timpe, et al. (the disclosure of which is incorporated herein by reference in its entirety), for example. U.S. Pat. No. 6,309,792 to Hauck, et al. describes suitable polycarboxylic acids that have an aromatic moiety substituted with a heteroatom. U.S. patent application Ser. No. 10/283,757 (U.S. Pub. App. 2004/0091811) of Munnelly, et al. and U.S. patent application Ser. No. 10/847,708 of Munnelly, et al. describe suitable monocarboxylic acid additives.

Polymerizable Component

The imageable layer comprises a polymerizable or crosslinkable component. The polymerization or crosslinking of the polymerizable or crosslinkable component may be radically initiated, for example.

The polymerizable or crosslinkable component includes at least one ethylenically unsaturated compound that undergoes free radical-initiated polymerization or crosslinking. The ethylenically unsaturated compound can be a polymerizable monomer, for instance. Suitable monomers are typically multifunctional, i.e., they comprise more than one ethylenically unsaturated, free radical polymerizable group. Typical multifunctional monomers are unsaturated esters of alcohols, preferably acrylate and methacrylate esters of polyols. Oligomers and/or prepolymers, such as urethane acrylates and methacrylates, epoxide acrylates and methacrylates, polyester acrylates and methacrylates, polyether acrylates and methacrylates and unsaturated polyester resins, may also be used.

Numerous other unsaturated monomers polymerizable by free-radical initiated polymerization and useful in polymerizable compositions are known to those skilled in the art and are described, for example, in *Photoreactive Polymers: The Science and Technology of Resists*, A. Reiser, Wiley, New York, 1989, pp. 102-177; in "Photopolymers: Radiation Curable Imaging Systems," by B. M. Monroe, in *Radiation Curing: Science and Technology*, S. P. Pappas, Ed., Plenum, New York, 1992, pp. 399-440; and "Polymer Imaging" by A. B. Cohen and P. Walker, in *Imaging Processes and Material*, J. M. Sturge, et al., Eds., Van Nostrand Reinhold, New York, 1989, pp. 226-262.

The polymerizable component of the invention is present in sufficient amount to render imaged areas insoluble in an aqueous developer after exposure to heat or radiation. The weight ratio of polymerizable component to binder ranges from about 5:95 to about 95:5, preferably from about 10:90 to about 90:10, more preferably from about 20:80 to about 80:20, most preferably from about 30:70 to about 70:30.

Initiator System

The polymerizable composition includes an initiator system for initiating a polymerization reaction upon imagewise exposure of the imageable element. Upon exposure to heat or radiation, the initiator system generates free radicals to initiate the polymerization reaction. The initiator system may be responsive, for example, to electromagnetic radiation in the ultraviolet, visible and/or infrared spectral regions, corresponding to the spectral range of about 300-1400 nm.

Suitable initiator systems will be recognized by those skilled in the art. In some embodiments, the initiator system comprises a compound (or compounds) that generates free radicals when the imageable element is thermally imaged. Thermally sensitive free radical generators include, for example, peroxides such as benzoyl peroxide; hydroperoxides such as cumyl hydroperoxide; azo compounds such as azo bis-isobutyronitrile; 2,4,5-triarylimidazolyl dimers (hexaarylbisimidazoles) such as are disclosed in Dueber, et al., U.S. Pat. No. 4,565,769; trihalomethyl triazines; borate salts; and onium salts, for example, diazonium salts, iodonium salts, sulfonium salts, phosphonium salts, and pyridinium salts; and mixtures thereof. Diaryliodonium salts and triarylsulfonium salts are especially suitable onium salts. The polymerizable composition typically comprises about 0.5 to about 7 wt.-% of a radical-generating compound.

In some embodiments, the initiator system is sensitive to infrared radiation. The infrared radiation may be in the range from about 800 to about 1200 nm, for example. An imageable layer that is to be imaged with infrared radiation typically comprises an infrared absorber, known as a "photothermal conversion material." Photothermal conversion materials absorb radiation and convert it to heat. Although a photothermal conversion material is not necessary for imaging with a hot body, imageable elements that contain a photothermal conversion material may also be imaged with a hot body, such as a thermal head or an array of thermal heads.

The photothermal conversion material may be any material that can absorb radiation and convert it to heat. Suitable materials include dyes and pigments. Suitable pigments include, for example, carbon black, Heliogen Green, Nigrosine Base, iron (III) oxide, manganese oxide, Prussian Blue, and Paris blue. The size of the pigment particles should not be more than the thickness of the layer that contains the pigment. Most suitably, the size of the particles will be half the thickness of the layer or less. The amount of photothermal conversion material present in the imageable layer is generally sufficient to provide an optical density of at least 0.05, and preferably, an optical density of from about 0.5 to at least about 2 to 3 at the imaging wavelength. The polymerizable composition typically comprises about 0.5 to about 7 wt.-% of a photothermal conversion material.

The photothermal conversion material may include a dye with the appropriate absorption spectrum and solubility. Dyes, especially dyes with a high extinction coefficient in the range of 750 nm to 1200 nm, are preferred. Examples of suitable dyes include dyes of the following classes: methine, polymethine, arylmethine, cyanine, hemicyanine, streptocyanine, squarylium, pyrylium, oxonol, naphthoquinone, anthraquinone, porphyrin, azo, croconium, triarylamine, thiazolium, indolium, oxazolium, indocyanine, indotricarbocyanine, oxatricarbocyanine, phthalocyanine, thiocyanine, thiatricarbocyanine, merocyanine, cryptocyanine, naphthalocyanine, polyaniline, polypyrrole, polythiophene, chalcogenopyryloarylidene and bis(chalcogenopyrylo)polymethine, oxyindolizine, pyrazoline azo, and oxazine classes. Infrared-absorbing dyes are disclosed in numerous publications, for example, European Patent Application 0 823 327 of Nagasaka, et al., U.S. Pat. No. 4,973,572 to DeBoer, and U.S. Pat. No. 5,208,135 to Patel, et al. Other examples of useful infrared-absorbing dyes include ADS-830A and ADS-1064 available from American Dye Source, Inc. (Baie D'Urfe, Quebec, Canada).

For imageable elements that are to be developed by contact with ink and/or fountain solution, water-soluble photothermal conversion materials may be suitable. Water-soluble photothermal conversion materials include, for example, cyanine dyes which one or more sulfate and/or sulfonate groups. Infrared-absorbing cyanine anions that contain two to four sulfonate groups are reported, for example, in U.S. Pat. No. 5,107,063 to West, et al., U.S. Pat. No. 5,972,838 to Pearce, et al., U.S. Pat. No. 6,187,502 to Chapman, et al., and U.S. Pat. No. 5,330,884 to Fabricius, et al.

In other embodiments, the initiator system includes an ultraviolet, visible or infrared absorber as a photosensitizer, and an electron acceptor capable of producing free radicals. The initiator system may also include a coinitiator capable of donating an electron and/or hydrogen atom and/or of forming a free radical. Examples of such initiator systems include: trihalomethyl triazines alone or together with a separate photosensitizer, for example, as described in U.S. Pat. No. 4,997,745 to Kawamura, et al.; spectral sensitizers for visible light activation, together with trihalomethyl triazines, as described, for example in U.S. Pat. No. 5,599,650 to Bi, et al.; 3-ketocoumarins, for ultraviolet and visible light activation, together with a polycarboxylic acid coinitiator, such as anilino-N,N-diacetic acid, and a secondary coinitiator, such as diaryliodonium salts, titanocenes, haloalkyl triazines, hexaaryl bisimidizoles, borate salts and photooxidants containing a heterocyclic nitrogen atom that is substituted by an alkoxy or acyloxy group, as described in U.S. Pat. No. 5,942,372 to West, et al.; a cyanine dye, diaryliodonium salt and a coinitiator having a carboxylic acid group bonded via a methylene group to a N, O or S group, which is directly attached to an aromatic ring, as described in U.S. Pat. No. 5,368,990 to Kawabata, et al.; a cyanine dye, for infrared radiation activation, together with a trihalomethyl triazine and an organoboron salt, as described in U.S. Pat. No. 5,496,903 to Watanabe, et al.; an infrared radiation absorber, a compound capable of producing an initiating free radical, including trichloromethyl triazines and azinium compounds and a polycarboxylic acid coinitiator having a carboxylic acid group bonded via a methylene group to a N, O S group, which is directly attached to an aromatic ring, as described in U.S. Pat. No. 6,309,792 to Hauck, et al.

Binder

The polymerizable composition of the imageable layer also comprises a polymeric binder having a hydrophobic backbone, pendant cyano groups attached to the hydrophobic backbone, and pendant groups including a hydrophilic poly(alkylene oxide) segment. A combination of such binders may also be employed. In some embodiments, the imageable layer includes a combination of binders, which may include an optional "co-binder" (described below) not meeting the foregoing description.

The polymerizable composition includes about 10 wt.-% to about 80 wt.-%, more suitably about 20 wt.-% to about 50 wt.-%, and most suitably about 30 wt.-% to about 40 wt.-% of total binder (i.e., total quantity of binder and co-binders). The total binder is generally present in sufficient amount to render the photopolymerizable composition soluble or dispersible in an aqueous developer. From 0 wt.-% to about 50 wt.-%, more suitably from about 1 wt.-% to about 30 wt.-% of the polymerizable composition, may be the co-binder(s).

The polymeric binder is generally a solid at room temperature, and is typically a non-elastomeric thermoplastic. The polymeric binder comprises both hydrophilic and hydrophobic regions. Although not bound by any theory, the combination of hydrophobic and hydrophilic regions is thought to be important for enhancing differentiation of the exposed and unexposed areas, to facilitate developability.

Generally the polymeric binder is characterized by a number average molecular weight ($M_n$) in the range from about 10,000 Da to about 250,000 Da, more commonly in the range from about 25,000 Da to about 200,000 Da. The polymerizable composition may comprise discrete particles of the polymeric binder. Preferably, the discrete particles are particles of the polymeric binder which are suspended in the polymerizable composition. The average diameter of the particles in the suspension may be in the range from about 0.01 micron to about 1 micron, more suitably in the range from about 100 nm to about 700 nm. In some embodiments, the average diameter of the particles in the suspension is in the range from about 150 nm to about 250 nm. The presence of discrete particles tends to promote developability of the unexposed areas.

The polymeric binder may be an addition polymer or a condensation polymer. Addition polymers may be prepared from acrylate and methacrylate esters, acrylic and methacrylic acid, methyl methacrylate, allyl acrylate and methacrylate, acrylamides and methacrylamides, acrylonitrile and methacrylonitrile, styrene, hydroxystyrene or a combination thereof, for example. Suitable condensation polymers include polyurethanes, epoxy resins, polyesters, polyamides and phenolic polymers, including phenol/formaldehyde and pyrogallol/acetone polymers.

The polymeric binder includes a hydrophobic backbone (or main chain), including constitutional units having attached pendant groups. In some embodiments, the hydrophobic backbone is an all-carbon backbone, such as where the polymeric binder is a copolymer derived from a combination of ethylenically unsaturated monomers. In other embodiments, the hydrophobic backbone may include heteroatoms, such as where the polymeric binder is formed by a condensation reaction or some other means.

The polymeric binder includes a plurality of constitutional units having pendant cyano groups (—C≡N) attached directly to the hydrophobic backbone. By way of example only, constitutional units having pendant cyano groups include —[CH$_2$CH(C≡N)—] and —[CH$_2$C(CH$_3$)(C≡N)—].

Constitutional units having pendant cyano groups can derive from ethylenically unsaturated monomers such as acrylonitrile or methacrylonitrile, for example, or from a combination thereof. As used herein, the term "(meth)acrylonitrile" indicates that either acrylonitrile or methacrylonitrile, or a combination of acrylonitrile and methacrylonitrile, is suitable for the stated purpose.

In some embodiments of the invention, the polymeric binder is a copolymer derived from (meth)acrylonitrile as one co-monomer. However, constitutional units having pendant cyano groups can also be introduced into the polymer by other conventional means. By way of example, the polymeric binder may be a copolymer derived from a cyanoacrylate monomer, such as methyl cyanoacrylate or ethyl cyanoacrylate. In an alternative embodiment, the polymeric binder may be derived from a combination of (meth) acrylonitrile and a cyanoacrylate monomer.

The polymeric binder also includes a plurality of constitutional units having pendant groups including a hydrophilic poly(alkylene oxide) segment. The poly(alkylene oxide) segment can be an oligomer or polymer containing a block of alkylene oxide constitutional units, for example. Generally, the pendant group will be predominantly the poly (alkylene oxide) segment (or more than one such segment), but may also comprise connecting groups and terminal groups.

In some embodiments, the alkylene oxide constitutional units are ($C_1$-$C_6$) alkylene oxide groups, more typically ($C_1$-$C_3$) alkylene oxide groups. For example, the poly(alkylene oxide) segment can comprise straight or branched alkylene oxide groups comprising 1 to 3 carbons, including —[$CH_2O$—], —[$CH_2CH_2O$—], —[$CH(CH_3)O$—], —[$CH_2CH_2CH_2O$—], —[$CH(CH_3)CH_2O$—], —[$CH_2CH(CH_3)O$—], or substituted versions of any of the foregoing. In some embodiments, the poly(alkylene oxide) segment consists of such constitutional units. In one embodiment, the poly(alkylene oxide) segment consists of —[$CH_2CH_2O$—] constitutional units.

The poly(alkylene oxide) segments typically comprise a total of about 5 to about 150 alkylene oxide constitutional units. Generally the number average molecular weight (Mn) of the poly(alkylene oxide) segments ranges from about 300 to about 10,000 Da, more suitably from about 500 Da to about 5,000 Da, and typically from about 1000 Da to about 3,000 Da.

One example of a suitable pendant group including a poly(alkylene oxide) segment is a pendant group of the form:

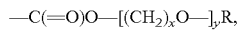
—C(=O)O—[($CH_2$)$_x$O—]$_y$R, where x is 1 to 3, y is in the range from about 5 to about 150, and where R is a suitable terminal group. Suitable terminal groups R may include, as non-limiting examples, alkyl groups of one to six carbon atoms, such as methyl, ethyl, n-propyl, iso-propyl, n-butyl, sec-butyl, iso-butyl, t-butyl, n-pentyl, iso-pentyl, neo-pentyl, n-hexyl, iso-hexyl, 1,1-dimethyl-butyl, 2,2-dimethyl-butyl, cyclopentyl, and cyclohexyl.

A particular example of a suitable pendant group including a poly(alkylene oxide) segment is a pendant group of the form:

—C(=O)O—[$CH_2CH_2O$—]$_y$$CH_3$, where y is in the range from about 10 to about 100, and more suitably y is in the range from about 25 to about 75. In one embodiment, y is in the range from about 40 to about 50.

In a particular embodiment of the invention, the main chain of the polymeric binder of the invention also comprises constitutional units derived from other suitable polymerizable monomers or oligomers. For example, the polymeric binder may comprise constitutional units derived from acrylate esters, methacrylate esters, styrene, hydroxystyrene, acrylic acid, methacrylic acid, methacrylamide, or a combination of any of the foregoing. Especially suitable are constitutional units derived from styrene or methacrylamide. Also suitable are constitutional units derived from methyl methacrylate or allyl methacrylate. In particular, constitutional units having pendant unsubstituted or substituted phenyl groups attached directly to the hydrophobic backbone may be useful. Substituted phenyl groups include, for example, 4-methylphenyl, 3-methylphenyl, 4-methoxyphenyl, 4-cyanophenyl, 4-chlorophenyl, 4-fluorophenyl, 4-acetoxyphenyl, and 3,5-dichlorophenyl. Such constitutional units may be derived from styrene or substituted styrenic monomers, for instance.

In some embodiments, the polymeric binder includes constitutional units having pendant groups that contain siloxane functionality. Suitable polymeric binders, and the preparation thereof, are described in copending U.S. patent application Ser. No. 10/842,111 entitled "On-Press Developable Imageable Element" (referenced in the first paragraph of the present specification).

In the polymeric binder of the present invention, a large percentage of the total recurring units include pendant cyano groups. Generally from about 70 to about 99.9 mol-%, and typically from about 75 to about 95 mol-%, of the total constitutional units in the polymeric binder include pendant cyano groups attached directly to the hydrophobic backbone. The polymeric binder includes only a small fraction of constitutional units having a pendant group including a hydrophilic poly(alkylene oxide) segment. Generally from about 0.1 to about 5 mol-%, and typically from about 0.5 to about 2 mol-%, of the total constitutional units in the polymeric binder have a pendant group including a hydrophilic poly(alkylene oxide) segment. When included, a minor fraction of the total constitutional units of the polymeric binder are derived from other monomers (such as styrene, acrylonitrile, etc.). Generally from 0 to about 30 mol-%, typically from about 2 to about 20 mol-%, and more suitably from about 5 to about 15 mol-%, of the total constitutional units in the polymeric binder are derived from other monomers.

In one embodiment, the polymeric binder is a random copolymer consisting essentially of: i) the constitutional units having a pendant cyano group attached directly to the hydrophobic backbone; ii) the constitutional units having pendant groups including a hydrophilic poly(alkylene oxide) segment; and iii) constitutional units having pendant unsubstituted or substituted phenyl groups attached directly to the hydrophobic backbone. In another embodiment, the polymeric binder is a random copolymer consisting essentially of: i) constitutional units of the form —[$CH_2C(R)(C≡N)$—]; ii) constitutional units of the form —[$CH_2C(R)(PEO)$—], wherein PEO represents a pendant group of the form —C(=O)O—[$CH_2CH_2O$—]$_y$$CH_3$, wherein y is in the range from about 25 to about 75; and iii) constitutional units of the form: —[$CH_2CH(Ph)$—]; wherein each R independently represents —H or —$CH_3$, and Ph represents a pendant phenyl group. In yet another embodiment, the polymeric binder is a random copolymer in which about 70 to about 99.9 mol-% of the total constitutional units in the random copolymer are of the form —[$CH_2C(R)(C≡N)$—]; about 0.1 to about 5 mol-% of the total constitutional units in the random copolymer are constitutional units of the form —[$CH_2C(R)(PEO)$—]; and about 2 to about 20 mol-% of the total constitutional units in the random copolymer are of the form —[$CH_2CH(Ph)$—].

The polymeric binder is typically a random copolymer obtained by a free-radical copolymerization of co-monomers. In a typical preparation, a mixture of at least two co-monomers, one that is a precursor of the constitutional units having pendant cyano groups, another that is a precursor of the constitutional units having a pendant group including the poly(alkylene oxide) segment (more properly termed a "macromer"), are co-polymerized. As used herein, the phrases "mixture of monomers" and "combination of monomers" are used for simplicity to include a mixture or combination of one or more polymerizable monomers and/or polymerizable macromers.

By way of example only, the polymeric binder can be formed by polymerization of a combination or mixture of suitable monomers/macromers, such as:

A) acrylonitrile, methacrylonitrile, or a combination thereof (i.e., "(meth)acrylonitrile");

B) poly(alkylene glycol) esters of acrylic acid or methacrylic acid, such as poly(ethylene glycol) methyl ether acrylate, poly(ethylene glycol) methyl ether methacrylate, or a combination thereof (i.e., "poly(ethylene glycol) methyl ether (meth)acrylate"); and C) optionally, monomers such as styrene, acrylamide, methacrylamide, etc., or a combination of suitable monomers.

Precursors useful as macromer B include, for example, polyethylene glycol monomethacrylate, polypropylene glycol methyl ether methacrylate, polyethylene glycol ethyl ether methacrylate, polyethylene glycol butyl ether methacrylate, polypropylene glycol hexyl ether methacrylate, polypropylene glycol octyl ether methacrylate, polyethylene glycol methyl ether acrylate, polyethylene glycol ethyl ether acrylate, polyethylene glycol phenyl ether acrylate, polypropylene glycol monoacrylate, polypropylene glycol monomethacrylate, polypropylene glycol methyl ether methacrylate, polypropylene glycol ethyl ether methacrylate, polypropylene glycol butyl ether methacrylate, polyethylene glycol/propylene glycol) methyl ether methacrylate, poly(vinyl alcohol) monomethacrylate, polyvinyl alcohol) monoacrylate, or a mixture thereof. Precursors commonly used as monomer B include poly(ethylene glycol) methyl ether methacrylate, poly(ethylene glycol) acrylate, poly(propylene glycol) methyl ether methacrylate, or a combination thereof. As used herein, the term "(meth) acrylate" with respect to a polymerizable macromer indicates that either an acrylate macromer or a methacrylate macromer, or a combination of acryl ate macromers and methacrylate macromers, is suitable for the stated purpose. Also, the phrase "alkyl ether" with respect to a macromer indicates a lower alkyl ether, generally a ($C_1$-$C_6$) linear or branched saturated alkyl ether, such as, e.g., a methyl ether or ethyl ether.

Suitable monomers that may be used as optional monomer C include, for example, acrylic acid, methacrylic acid, acrylate esters, methacrylate esters such as methyl methacrylate, allyl methacrylate, hydroxyethyl methacrylate, styrene, hydroxystyrene, methacrylamide, or a combination of any of the foregoing. Especially suitable are styrene or methacrylamide, or monomers derived therefrom. Specific examples of suitable monomers include styrene, 3-methyl styrene, 4-methyl styrene, 4-methoxy styrene, 4-acetoxy styrene, alpha-methyl styrene, acrylic acid, methyl acrylate, ethyl acrylate, butyl acrylate, n-hexyl acrylate, methacrylic acid, methyl methacrylate, ethyl methacrylate, n-propyl methacrylate, n-butyl methacrylate, n-pentyl methacrylate, neo-pentyl methacrylate, cyclohexyl methacrylate, n-hexyl methacrylate, 2-ethoxyethyl methacrylate, 3-methoxypropyl methacrylate, allyl methacrylate, vinyl acetate, vinyl butyrate, methyl vinyl ketone, butyl vinyl ketone, vinyl fluoride, vinyl chloride, vinyl bromide, maleic anhydride, maleimide, N-phenyl maleimide, N-cyclohexyl maleimide, N-benzyl maleimide, and mixtures thereof.

By way of example, the polymeric binder described above may be prepared by free radical polymerization. Free radical polymerization is well known to those skilled in the art and is described, for example, in Chapters 20 and 21, of *Macromolecules*, Vol. 2, 2nd Ed., H. G. Elias, Plenum, New York, 1984. Useful free radical initiators are peroxides such as benzoyl peroxide, hydroperoxides such as cumyl hydroperoxide and azo compounds such as 2,2'-azo bis-isobutyronitrile (AIBN). Chain transfer agents, such as dodecyl mercaptan, may be used to control the molecular weight of the compound.

In one embodiment, the polymeric binder is a copolymer derived from a combination of polymerizable monomers that includes at least 50 wt.-% of monomer A.

In another embodiment, the polymeric binder is a copolymer derived from: about 55 to about 90 percent (meth) acrylonitrile, by weight; about 5 to about 15 percent poly (ethylene glycol) alkyl ether (meth)acrylate, by weight; and about 5 to about 30 percent styrene, by weight. In yet another embodiment, the polymeric binder is a copolymer derived from a combination of monomers consisting essentially of: about 55 to about 90 percent (meth)acrylonitrile, by weight; about 5 to about 15 percent poly(ethylene glycol) alkyl ether (meth)acrylate, by weight; and about 5 to about 30 percent styrene, by weight. In still another embodiment, the polymeric binder is a copolymer derived from a combination of monomers consisting essentially of: about 55 to about 90 percent acrylonitrile, by weight; about 5 to about 15 percent poly(ethylene glycol) methyl ether methacrylate, by weight; and about 5 to about 30 percent styrene, by weight.

Suitable solvents for free radical polymerization include liquids that are inert to the reactants and which will not otherwise adversely affect the reaction, for example, esters such as ethyl acetate and butyl acetate; ketones such as methyl ethyl ketone, methyl isobutyl ketone, methyl propyl ketone, and acetone; alcohols such as methanol, ethanol, isopropyl alcohol, and butanol; ethers such as dioxane and tetrahydrofuran, and mixtures thereof.

However, the polymeric binder is preferably prepared in hydrophilic medium (water or mixtures of water and alcohol), which may facilitate the formation of particles dispersed in the solvent. Furthermore, it may be desirable to conduct the polymerization in a solvent system that does not completely dissolve the monomer(s) that result in constitutional units that provide hydrophobic character to the polymer backbone, such as acrylonitrile or methacrylonitrile. By way of example, the polymeric binder may be synthesized in a water/alcohol mixture, such as a mixture of water and n-propanol.

All monomers/macromers and polymerization initiators may be added directly to the reaction medium, with the polymerization reaction proceeding at an appropriate temperature determined by the polymerization initiator chosen. Alternatively, the macromers containing the poly(alkylene oxide) segment may be added to a reaction solvent first, followed by the slow addition of monomers at an elevated temperature. The initiator may be added to a monomer mixture, or to a solution of macromer, or both.

Although preparation of the polymeric binder has been described in terms of monomers and macromers that can be used to form the co-polymer, practice of the invention is not limited to the use of copolymers formed by polymerization of a mixture of co-monomers. The polymeric binder may be formed by other routes that will be apparent to those skilled in the art, such as by modification of precursor polymers. In some embodiments, the polymeric binder can be prepared as a graft copolymer, such as where the poly(alkylene oxide) segment is grafted onto a suitable polymeric precursor. Such grafting can be done, for example, by anionic, cationic, non-ionic, or free radical grafting methods.

By way of example only, the polymeric binder can be prepared by first copolymerizing a suitable combination of polymerizable monomers to produce a graftable copolymer, and thereafter grafting a functional group comprising the poly(alkylene oxide) segment onto the graftable copolymer. For instance, a graft copolymer may be prepared by reacting hydroxy-functional or amine functional polyethylene glycol monoalkyl ethers with a polymer having co-reactive groups, including acid chloride, isocyanate and anhydride groups. Other methods of preparation of the graft copolymers suitable for use in the present invention include methods described in the aforementioned U.S. Pat. No. 6,582,882.

Optional Co-Binder

In addition to the binder described above, the imageable layer may optionally comprise one or more co-binders. Typical co-binders are water-soluble or water-dispersible polymers, such as, cellulose derivatives such as carboxymethyl cellulose, methylcellulose, hydroxypropyl methylcellulose, hydroxypropyl cellulose, hydroxyethyl cellulose; polyvinyl alcohol; polyacrylic acid; polymethacrylic acid; polyvinyl pyrrolidone; polylactide; polyvinyl phosphonic acid; synthetic co-polymers, such as the copolymer of an alkoxy polyethylene glycol acrylate or methacrylate, for example methoxy polyethylene glycol acrylate or methacrylate, with a monomer such as methyl methacrylate, methyl acrylate, butyl methacrylate, butyl acrylate, or allyl methacrylate; and mixtures thereof.

In some embodiments, the co-binder provides crosslinkable sites. For example, the crosslinkable sites may be ethylenically unsaturated sites.

Preparation of an Imageable Element

The imageable elements may be prepared by applying the imageable layer over the hydrophilic surface of the lithographic substrate using conventional techniques. The imageable layer may be applied by any suitable method, such as coating or lamination.

Typically the ingredients of the imageable layer are dispersed or dissolved in a suitable coating solvent, such as water or a mixture of water and an organic solvent such as methanol, ethanol, iso-propyl alcohol, and/or acetone. A surfactant, such as a fluorinated surfactant or a polyethoxylated dimethylpolysiloxane copolymer, or a mixture of surfactants may be present to help disperse the other ingredients in the coating solvent. The resulting mixture is coated onto the lithographic substrate by conventional methods, such as spin coating, bar coating, gravure coating, die coating, slot coating, or roller coating.

After coating, the imageable layer is dried to evaporate the solvent. The imageable layer may be air dried at ambient temperature or at an elevated temperature, such as in an oven. Alternatively, the imageable layer may be dried by blowing warm air over the imageable element. The dry coating weight for the imageable layer is typically about 0.2 to about 5.0 g/m$^2$, more suitably from about 0.5 g/m$^2$ to about 1.5 g/m$^2$, and most suitably from about 0.75 g/m$^2$ and about 1.0 g/m$^2$.

Imaging and Processing of the Imageable Elements

The imageable element is imagewise exposed to produce exposed regions and unexposed regions of the imageable layer. Imagewise exposure initiates a polymerization reaction in exposed regions.

In some embodiments, imagewise exposure is done using infrared imaging radiation. The imageable element may, for example, be imagewise exposed using semiconductor lasers or laser diodes which emit in the near-infrared region of the electromagnetic spectrum. Such a laser beam can be digitally controlled via a computer; i.e. the laser can be turned on or off so that an imagewise exposure of the precursor can be effected via stored digitized information in the computer.

Presently, high-performance lasers or laser diodes used in commercially available image setters emit infrared radiation in the wavelength ranges of between 800 and 850 nm or between 1060 and 1120 nm. Other infrared-emitting light sources may also be suitable.

An example of an apparatus comprising a suitable radiation source for imagewise exposure is the Creo TRENDSETTER 3230 from CreoScitex (Burnaby, British Columbia), which contains a laser diode that emits near-infrared radiation at a wavelength of about 830 nm. Other apparatus comprising suitable radiation sources include the CRESCENT 42T PLATESETTER (Gerber Scientific, South Windsor, Conn.), an internal drum platesetter that operates at a wavelength of 1064 nm; and the PlateRite Model 8600 and Model 8800 available from Screen (USA) (Rolling Meadows, Ill.).

Other modes of imaging are also suitable for the practice of the present invention, provided that the necessary energy is supplied to the imageable layer to initiate the polymerization reaction. The imageable element may be thermally imaged using a hot body, for example, such as a conventional apparatus containing a thermal printing head. A suitable apparatus includes at least one thermal head but would usually include a thermal head array.

Imagewise exposure produces an imaged element, which comprises a latent image of exposed regions and complementary unexposed regions. Development of the imaged element to form a printing plate converts the latent image to an image by removing the unexposed regions, revealing the hydrophilic surface of the underlying substrate. To effect development, the imaged element is contacted with a developer solution, most suitably an aqueous developer, or with ink and/or fountain solution. The imageable elements of the present invention include on-press developable plates as well as plates which are intended for other development processes.

Development can take place in a conventional rinse/gum apparatus. The aqueous developer composition is dependent on the nature of the graft copolymer composition. Common components of aqueous developers include surfactants, chelating agents, such as salts of ethylenediamine tetraacetic acid, organic solvents, such as benzyl alcohol, and alkaline components, such as, inorganic metasilicates, organic metasilicates, hydroxides and bicarbonates. The pH of the aqueous developer is preferably within about 5 to about 14, depending on the nature of the graft copolymer composition. Numerous aqueous developer solutions are known to those skilled in the art.

Alternatively, the imaged element can be directly mounted on press after imaging and developed by contact with ink and/or fountain solution during the initial impressions. No separate development step is needed before mounting on press. This eliminates the separate development step along with both the processor and developer, thus simplifying the printing process and reducing the amount of expensive equipment required and chemical waste generated. Typical ingredients of aqueous fountain solutions, in addition to water, include pH buffering systems, such as phosphate and citrate buffers; desensitizing agents, such as dextrin, gum arabic, and sodium carboxymethylcellulose; surfactants and wetting agents, such as aryl and alkyl sulfonates, polyethylene oxides, polypropylene oxides, and polyethylene oxide derivatives of alcohols and phenols; humectants, such as glycerin and sorbitol; low boiling solvents such as ethanol and 2-propanol; sequestrants, such as borax, sodium hexametaphosphate, and salts of ethylenediamine tetraacetic acid; biocides, such as isothiazolinone derivatives; and antifoaming agents.

For on-press imaging, the imageable element is imaged while mounted on a lithographic printing press cylinder, and the imaged element is developed on-press with fountain solution and/or ink during the initial press operation. This method does not comprise a separate development step. This method is especially suitable for computer-to-press applications in which the imageable element (or elements, for multiple color presses) is directly imaged on the plate cylinder according to computer-generated digital imaging information and, with minimum or no treatment, directly prints out regular printed sheets. An example of a direct imaging printing press is the SPEEDMASTER 74-DI press from Heidelberg USA, Inc. (Kennesaw, Ga.).

Once the imageable element has been imaged and developed to form a lithographic printing plate, printing can then be carried out by applying a fountain solution and then lithographic ink to the image on the surface of the plate. The fountain solution is taken up by the unimaged regions, i.e., the surface of the hydrophilic substrate revealed by the imaging and development process, and the ink is taken up by the imaged regions, i.e., the regions not removed by the development process. The ink is then transferred to a suitable receiving medium (such as cloth, paper, metal, glass or plastic) either directly or indirectly using an offset printing blanket to provide a desired impression of the image thereon.

Following development, a postbake may optionally be used to increase press life.

EXAMPLES

Glossary of Chemicals Used in Synthesis of Copolymers and in Coating Formulations Ammonium persulfate: $(NH_4)_2S_2O_8$ BYK 336: Modified dimethyl polysiloxane co-polymer in a 25% xylene/methoxypropyl acetate solution, available from Byk-Chemie USA Inc. (Wallingford, Conn.)

DESMODUR N100: Aliphatic polyisocyanate resin based on hexamethylene diisocyanate, available from Bayer Corp. (Milford, Conn.)

ELVACITE 4026: 10 wt.-% solution in 2-butanone of a highly-branched poly(methyl methacrylate) available from Lucite International, Inc. (Cordova, Tenn.)

IR Dye: The IR dye used in coating formulations is represented by the formula:

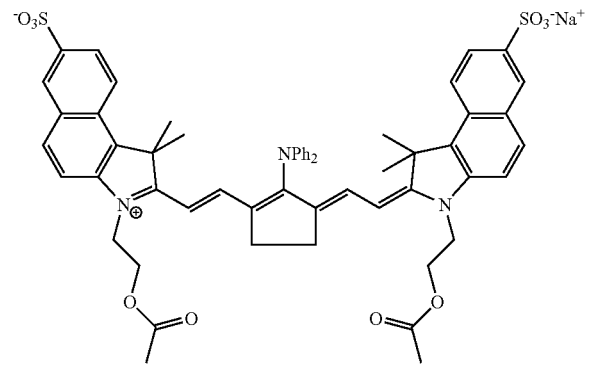

IRGACURE 250: 75 wt.-% solution of (4-methoxyphenyl)[4-(2-methylpropyl)phenyl] iodonium hexafluorophosphate in propylene carbonate, available from Ciba Specialty Chemicals (Tarrytown, N.Y.)

KLUCEL M: 2% Hydroxypropyl cellulose in water (viscosity: 5.000 mPa·s), available from Hercules Inc., Aqualon Division (Wilmington, Del.)

Mercapto-3-triazole: Mercapto-3-triazole-1 H, 2, 4 available from PCAS (Paris, France)

PAA: poly(acrylic acid)

PEGMA: Poly(ethylene glycol) methyl ether methacrylate; as a 50 wt.-% solution in water, average Mn ~2080, available from Sigma-Aldrich Corp. (St. Louis, Mo.)

PVPA: poly(vinyl phosphonic acid)

SARTOMER 355: Ditrimethylolpropane tetraacrylate, available from Sartomer Co., Inc. (Exton, Pa.)

TRENDSETTER 3244x: Commercially available platesetter, operating at a wavelength of 830 nm, available from Creo Products (Burnaby, British Columbia)

Urethane Acrylate: 80 wt.-% solution in 2-butanone of a urethane acrylate obtained by reaction of DESMODUR N100 with hydroxyethyl acrylate and pentaerythritol triacrylate VAZO-64: 2,2'-Azo bis-isobutyronitrile, available from E.I. du Pont de Nemours and Co. (Wilmington, Del.)

Synthesis of Copolymers (CAUTION! Some chemicals used in the following syntheses, including methacrylonitrile and azo bis-isobutyronitrile, are highly toxic.)

Example 1

Synthesis of Copolymer 1

A mixture of 54 g n-propanol and 16 g deionized water was charged into a 250-mL flask, which was heated to 70° C., purged with a steady flow of $N_2$ gas, and stirred with a mechanical stirrer.

A mixture of 54 g n-propanol, 16 g deionized water, 10 g PEGMA, 4.5 g styrene, 40.5 g acrylonitrile, and 0.32 g VAZO-64 was prepared in a separate beaker and then added dropwise to the 250-mL flask over a period of 30 min. About 2.5 hours later, 0.16 g VAZO-64 was added to the reaction mixture. The polymerization reaction continued for an additional 2 hours. The resulting polymer solution contained 21 wt.-% solid of Copolymer 1.

Example 2

Synthesis of Copolymer 2

2-Butanone (384.1 g) and 8.5 g PEGMA were charged in a 1-L four-necked flask under $N_2$ atmosphere and heated to 80° C. A pre-mixture of allyl methacrylate (38.0 g) and VAZO-64 (0.3 g) were added at 80° C. over a period of 90 minutes. After the addition was complete, an additional 0.13 g of VAZO-64 was added. Thereafter two additional doses of 0.13 g VAZO-64 were added. The polymer conversion based on percent non-volatiles was >98%.

In the coating formulations for the following Examples 11-14 and Comparative Example 19, Copolymer 2 is used in addition to Copolymers 1 and 3-7 as a crosslinkable binder.

Example 3

Synthesis of Copolymer 3

A mixture of 15 g PEGMA, 48 g water and 192 g 1-propanol was charged into a 500-mL flask, which was heated to 80° C. In a separate beaker, 66.9 g styrene and 0.48 g VAZO-64 were mixed, and part of this solution (12 g) was added to the mixture in the flask, which became hazy within about 10 minutes. Subsequently, the remaining solution was added to the flask over a 30-min period. After 3 additional hours, the resulting polymer solution contained 25 wt.-% solid of Copolymer 3.

Copolymer 3 has no pendant cyano group on the hydrophobic polymer backbone. Copolymer 3 is used as a binder in Comparative Example 19 below.

Example 4

Synthesis of Copolymer 4

A mixture of 50 g of water and 2.5 g of PEGMA was placed in a 250-mL three-necked flask, equipped with magnetic stirring, temperature controller, addition funnel and $N_2$ inlet. The mixture was heated to 70° C. with stirring.

A first portion of monomer mixture containing 2.1 g of methacrylonitrile was added to the flask, followed by the addition of 0.05 g of ammonium persulfate. The mixture was stirred at 70° C. for about 30 min and an additional 0.05 g of ammonium persulfate was added. A second portion of monomer mixture containing 17 g of methacrylonitrile, 13 g of n-propanol and 1.9 g of styrene was added slowly into the mixture over 2 hours. A final portion of 0.05 g of ammonium persulfate was added and the mixture was allowed to stir at 70° C. overnight (~20 hours). The resulting polymer solution contained 13.7 wt.-% solid of Copolymer 4.

Example 5

Synthesis of Copolymer 5

1.25 g of PEGMA was placed in a mixture of 0.05 g ammonium persulfate, 10 g water and 10 g n-propanol in a 50-mL three-necked flask, equipped with magnetic stirring, addition funnel and $N_2$ inlet. The mixture was heated to 70° C. under $N_2$ protection. A solution containing 1.0 g of styrene and 4.0 g of methacrylonitrile was added slowly to the three-necked flask via the addition funnel within a 1.5-hour period with stirring and temperature maintained at about 70° C. After 5 hours, an additional dose of 0.04 g ammonium persulfate was added. The reaction was stirred at 70° C. overnight (~20 hours). The resulting polymer solution contained 15.6 wt.-% solid of Copolymer 5.

Example 6

Synthesis of Copolymer 6

A mixture of 54 g n-propanol and 16 g deionized water was charged into a 250-mL flask, which was heated to 70° C., purged with a steady flow of $N_2$ gas, and stirred with a mechanical stirrer. A mixture of 54 g n-propanol, 16 g deionized water, 10 g PEGMA, 13.5 g styrene, 31.5 g acrylonitrile, and 0.48 g VAZO-64 was prepared in a separate beaker and added to the 250-mL flask dropwise over a period of 30 min. About 2.5 hours later, 0.16 g VAZO-64 was added to the reaction mixture. The polymerization reaction continued for an additional 2 hours. The resulting polymer solution contained 21.7 wt.-% solid of Copolymer 6.

Example 7

Synthesis of Copolymer 7

A mixture of 54 g n-propanol and 16 g deionized water was charged into a 250-mL flask, which was heated to 70° C., purged with a steady flow of $N_2$ gas, and stirred with a mechanical stirrer. A mixture of 54 g n-propanol, 16 g deionized water, 10 g PEGMA, 6.75 g styrene, 38.25 g acrylonitrile, and 0.48 g VAZO-64 was prepared in a separate beaker and added to the 250-mL flask dropwise over a period of 30 min. About 2.5 hours later, 0.16 g VAZO-64 was added to the reaction mixture. The polymerization reaction continued for a total of 19 hours. The resulting polymer solution contained 24 wt.-% solid of Copolymer 7.

Example 8

Synthesis of Copolymer 8

A solution of 20 g PEGMA dissolved in a mixture of 190 g deionized water and 200 g n-propanol was charged into a 1000 mL four-necked flask, and was heated slowly to slight reflux (~73° C.) under $N_2$ atmosphere. A pre-mixture of styrene (9 g), acrylonitrile (81 g) and VAZO-64 (0.7 g) was added over a 2-hour period. Six hours later, another aliquot of VAZO-64 (0.5 g) was added. The temperature was raised to 80° C. Subsequently, two more aliquots of VAZO-64 (0.35 g each) were added over a period of 6 hours. After reaction for a total of 19 hours, the conversion to copolymer was >98% based on a determination of percent non-volatiles. The weight ratio of PEGMA/styrene/acrylonitrile was 10:9:81, and ratio of n-propanol/water was 50:50. The residual acrylonitrile in solution was 0.08% based on a determination by $^1$H-NMR.

Example 9

Synthesis of Copolymer 9

A solution of 20 g PEGMA dissolved in a mixture of 50.5 g deionized water and 242.2 g n-propanol was charged into a 1000 mL four-necked flask, and was heated slowly to slight reflux (~73° C.) under $N_2$ atmosphere. A pre-mixture of styrene (9 g), acrylonitrile (81 g) and VAZO-64 (0.7 g) was added over a 2-hour period. Six hours later, another aliquot of VAZO-64 (0.5 g) was added. The temperature was raised to 80° C. Subsequently, two more aliquots of VAZO-64 (0.35 g each) were added over a period of 6 hours. After reaction for a total of 19 hours, the conversion to graft copolymer was >98% based on a determination of percent non-volatiles. The weight ratio of PEGMA/styrene/acrylonitrile was 10:9:81 and ratio of n-propanol/water was 80:20. The residual acrylonitrile in solution was 0.25% based on a determination by $^1$H-NMR.

Example 10

Synthesis of Copolymer 10

A solution of 20 g PEGMA dissolved in a mixture of 74.8 g of deionized water and 241.4 g of n-propanol, was charged into a 1000 mL four-necked flask, and was heated slowly to slight reflux (76° C.) under $N_2$ atmosphere. A pre-mixture of styrene (20 g), acrylonitrile (70 g) and VAZO-64 (0.7 g) was added over a 2-hour period. Six hours later, another aliquot of VAZO-64 (0.5 g) was added. The temperature was raised to 80° C. Subsequently, two more aliquots of VAZO-64 (0.35 g each) were added over a period of 6 hours. After reaction for a total of 19 hours, the conversion to copolymer was >98% based on a determination of percent non-volatiles. The weight ratio of PEGMA/styrene/acrylonitrile was 10:20:70 and n-propanol/water ratio is 76:24. The residual acrylonitrile in solution was 0.5% based on determination by $^1$H-NMR.

Properties of Copolymers 1-10

Particle size was measured using a MICROTRAC UPA150 ultrafine particle size analyzer available from Microtrac (North Largo, Fla.). Data for Copolymers 1-7 are reported in Table 1 (n/a—not determined).

In the table, "ma" is the mean diameter of the area distribution; "mv" is the mean diameter of the volume distribution, and represents the "center of gravity" of the distribution. The calculation of mv is weighted for coarse particles. The area mean ma is less weighted than mv for coarse particles, and therefore shows smaller particle size. The "50%ile" value is a median particle diameter.

Molecular weight was determined using gel permeation chromatography in dimethylformamide ("DMF") in most cases, or tetrahydrofuran ("THF") where indicated. $M_p$ is peak-average molecular weight; $M_n$ is number-average molecular weight; $M_w$ is weight-average molecular weight; polydispersity is defined as $M_w/M_n$.

a Ranar conveyor oven set at 90° C., to yield a printing plate precursor. The dry coating weight obtained was 1.5 g/m$^2$.

TABLE 2

Coating composition for Example 11.

| Component | Parts by Weight |
|---|---|
| Urethane Acrylate | 2.48 |
| Copolymer 1[1] | 13.53 |
| Copolymer 2[2] | 3.97 |
| IRGACURE 250 | 0.42 |
| IR absorbing dye | 0.13 |
| Mercapto-3-triazole | 0.18 |
| BYK 336 | 0.60 |
| KLUCEL M | 3.31 |
| n-Propanol | 61.97 |
| Water | 13.41 |

[1]Copolymer 1 as used in coating formulations is a dispersion of 21 wt.-% solids in an 80/20 mixture of n-propanol/water. The quantity shown in the table is the weight of the dispersion that was used, including solvent.
[2]Copolymer 2 as used in coating formulations is a solution of 10 wt.-% solids in 2-butanone.

The resulting precursor for Example 11 was imaged on a Creo TRENDSETTER 3244x at 250 mJ/cm$^2$ and then

TABLE 1

Properties of Copolymers 1–10.

| | Particle Size (nm) | | | Molecular Weight (Da) (GPC in DMF) | | | Polydispersity |
|---|---|---|---|---|---|---|---|
| Binder | ma | mv | 50% ile | $M_p$ | $M_n$ | $M_w$ | $M_w/M_n$ |
| Copolymer 1 (TD23) | 364 | 440 | 345 | 98,961 | 60,727 | 128,971 | 2.124 |
| Copolymer 2[1] (ACR1563-02) | n/a | n/a | n/a | 51,048 | 12,394 | 44,887 | 3.621 |
| Copolymer 3 (ACR1559) | 268 | 335 | 256 | 82,048 | 54,800 | 157,163 | 2.868 |
| Copolymer 4[2] (MASP-013) | 282 | 371 | 296 | 112,138 | 102,827 | 123,182 683,174 | 1.198 |
| Copolymer 5[3] (S-005) | 423 | 724 | 209(32%), 967(68%) | — | — | 56,859 716,374 | — |
| Copolymer 6 (TD24) | 617 | 670 | 695 | — | — | — | — |
| Copolymer 7 (TD23-10) | — | — | — | — | — | — | — |
| Copolymer 8 (ACR-1693) | 188 | 225 | 203 | 173,332 | 64,791 | 192,641 | 2.973 |
| Copolymer 9 (ACR-1710) | 165 | 195 | 193 | — | — | — | — |
| Copolymer 10 (ACR-1731) | — | — | 180 | — | — | — | — |

[1]Solvent for particle size determination for Copolymer 2 was THF.
[2]Copolymer 4 exhibited a bimodal distribution in molecular weight determination.
[3]Copolymer 5 exhibited a bimodal distribution for both particle size and molecular weight determinations.

Preparation of Printing Plate Precursors and Printing Plates

Example 11

Printing Plate Prepared with Copolymer 1

To a brush-grained and phosphoric acid-anodized aluminum substrate that had been post-treated with poly(acrylic acid) ("PAA"), the coating composition specified in Table 2 was applied. The coating composition was applied using a wire-wound rod and then dried for approximately 90 sec in mounted directly on a Komori press charged with Graphics Equinox black ink, fountain solution containing Varn Litho Etch 142W at 3 oz./gal. and PAR alcohol replacement at 3 oz./gal. (both available from Varn International of Addison, Ill.), and a hard blanket. The print-out of the image areas for this plate were blue and easily visible while the non-image areas remained pale blue. The plate printed more than 30,000 copies of good quality prints.

While on press, image areas were treated independently with Aqua Image plate preserver/cleaner solution available from Kodak Polychrome Graphics (Norwalk, Conn.) or V-120 press wash available from Varn International. Image areas treated with either the Aqua Image plate preserver/ cleaner solution or V-120 were unaffected and wore at the same rate as untreated image areas.

Example 12

Printing Plate Prepared with Copolymer 4

To a brush-grained and phosphoric acid-anodized aluminum substrate that had been post-treated with PAA, the coating composition specified in Table 3 was applied. The coating composition was applied using a wire-wound rod and then dried for approximately 90 sec in a Ranar conveyor oven set at 90° C., to yield a printing plate precursor. The dry coating weight obtained was 1.5 g/m².

TABLE 3

Coating composition for Example 12.

| Component | Parts by Weight |
|---|---|
| Urethane Acrylate | 2.33 |
| Copolymer 4[1] | 21.72 |
| Copolymer 2 | 5.56 |
| IRGACURE 250 | 0.39 |
| IR absorbing dye | 0.12 |
| Mercapto-3-triazole | 0.17 |
| BYK 336 | 0.56 |
| KLUCEL M | 3.09 |
| n-Propanol | 23.88 |
| 2-Butanone | 13.3 |
| Water | 28.8 |

[1]Copolymer 4 as used in coating formulations is a dispersion of 14 wt.-% solids in an 20/80 mixture of n-propanol/water. The quantity shown in the table is the weight of the dispersion that was used, including solvent.

The resulting precursor for Example 12 was imaged on a Creo TRENDSETTER 3244x at 262 mJ/cm² and then mounted directly on an ABDick press charged with Van Son Rubber Base Black ink and fountain solution containing Varn Litho Etch 142W at 3 oz./gal. and PAR alcohol replacement at 3 oz./gal. The print-out of the image areas for this plate were blue and easily visible while the non-image areas remained pale blue. The plate printed 250 copies of good quality prints when the press was stopped.

Example 13

Printing Plate Prepared with Copolymer 5

To a brush-grained and phosphoric acid-anodized aluminum substrate that had been post-treated with PAA, the coating composition described in Table 4 was applied. The coating composition was applied using a wire-wound rod and then dried for approximately 90 sec residence time in a Ranar conveyor oven set at 90° C., to yield a printing plate precursor. The dry coating weight obtained was 1.5 g/m².

TABLE 4

Coating composition for Example 13.

| Component | Parts by Weight |
|---|---|
| Urethane Acrylate | 2.32 |
| Copolymer 5[1] | 19.08 |
| Copolymer 2 | 5.56 |
| IRGACURE 250 | 0.39 |
| IR absorbing dye | 0.12 |
| Mercapto-3-triazole | 0.17 |
| BYK 336 | 0.56 |
| KLUCEL M | 3.09 |
| n-Propanol | 14.89 |
| 2-Butanone | 17.99 |
| Water | 35.83 |

[1]Copolymer 5 as used in coating formulations is a dispersion of 16 wt.-% solids in a 50/50 mixture of n-propanol/water. The quantity shown in the table is the weight of the dispersion that was used, including solvent.

The resulting precursor for Example 13 was imaged on a Creo TRENDSETTER 3244x at 262 mJ/cm² and then mounted directly on an ABDick press charged with Van Son Rubber Base Black ink and fountain solution containing Varn Litho Etch 142W at 3 oz./gal. and PAR alcohol replacement at 3 oz./gal. The print-out of the image areas for this plate were blue and easily visible while the non-image areas remained pale blue. The plate printed 250 copies of good quality prints when the press was stopped.

Example 14

Printing Plate Prepared with Copolymer 6

To a brush-grained and phosphoric acid-anodized aluminum substrate that had been post-treated with PAA, the coating composition described in Table 5 was applied. The coating composition was applied using a wire-wound rod and then dried for approximately 90 sec residence time in a Ranar conveyor oven set at 90° C., to yield a printing plate precursor. The dry coating weight obtained was 1.5 g/m².

TABLE 5

Coating composition for Example 14.

| Component | Parts by Weight |
|---|---|
| Urethane Acrylate | 2.48 |
| Copolymer 6[1] | 15.60 |
| Copolymer 2 | 3.97 |
| IRGACURE 250 | 0.42 |
| IR absorbing dye | 0.13 |
| Mercapto-3-triazole | 0.18 |
| BYK 336 | 0.60 |
| KLUCEL M | 3.31 |
| n-Propanol | 60.32 |
| Water | 12.99 |

[1]Copolymer 6 as used in coating formulations is a dispersion of 21.7 wt.-% solids in an 80/20 mixture of n-propanol/water. The quantity shown in the table is the weight of the dispersion that was used, including solvent.

The resulting precursor for Example 14 was imaged on a Creo TRENDSETTER 3244x at 262 mJ/cm² and then mounted directly on an ABDick press charged with Van Son Rubber Base Black ink and fountain solution containing Varn Litho Etch 142W at 3 oz./gal. and PAR alcohol replacement at 3 oz./gal. The print-out of the image areas for this plate were blue and easily visible while the non-image areas remained pale blue. The plate printed 250 copies of good quality prints when the press was stopped.

Example 15

Printing Plate Prepared with Copolymer 7

To a brush-grained and phosphoric acid-anodized aluminum substrate that had been post-treated with PAA, the coating composition described in Table 6 was applied. The coating composition was applied using a wire-wound rod and then dried for approximately 90 sec residence time in a Ranar conveyor oven set at 90° C., to yield a printing plate precursor. The dry coating weight obtained was 1.5 g/m².

TABLE 6

Coating composition for Example 15.

| Component | Parts by Weight |
|---|---|
| Urethane Acrylate | 2.48 |
| Copolymer 7[1] | 12.99 |
| ELVACITE 4026 | 3.30 |
| IRGACURE 250 | 0.42 |
| IR absorbing dye | 0.13 |
| Mercapto-3-triazole | 0.18 |
| BYK 336 | 0.60 |
| KLUCEL M | 3.30 |
| SARTOMER 355 | 0.33 |
| n-Propanol | 62.80 |
| Water | 13.47 |

[1]Copolymer 7 as used in coating formulations is a dispersion of 24 wt.-% solids in an 80/20 mixture of n-propanol/water. The quantity shown in the table is the weight of the dispersion that was used, including solvent.

The resulting precursor for Example 15 was imaged on a Creo TRENDSETTER 3244x at 254 mJ/cm² and then mounted directly on a Komori press charged with Graphics Equinox Black ink and fountain solution containing Varn Litho Etch 142W at 3 oz./gal. and PAR alcohol replacement at 3 oz./gal. The print-out of the image areas for this plate were blue and easily visible while the non-image areas remained pale blue. The plate printed more than 45,000 copies of good quality prints when the press was stopped.

While on press, image areas were treated with V-120 press wash. The areas treated with V-120 were unaffected and showed no wear during the entire press run.

Example 16

Printing Plate Prepared with Copolymer 8

To an electrochemically-grained and sulfuric acid-anodized aluminum substrate that had been post-treated with PVPA, the coating composition described in Table 7 was applied. The coating composition was applied using a wire-wound rod and then dried for approximately 90 sec residence time in a Ranar conveyor oven set at 90° C., to yield a printing plate precursor. The dry coating weight obtained was 1.5 g/m².

TABLE 7

Coating composition for Example 16.

| Component | Parts by Weight |
|---|---|
| Urethane Acrylate | 2.48 |
| Copolymer 8[1] | 18.89 |
| IRGACURE 250 | 0.42 |
| IR absorbing dye | 0.13 |
| Mercapto-3-triazole | 0.18 |
| BYK 336 | 0.60 |
| KLUCEL M | 3.30 |
| n-Propanol | 61.58 |
| Water | 12.42 |

[1]Copolymer 8 as used in coating formulations is a dispersion of 20 wt.-% solids in a 50/50 mixture of n-propanol/water. The quantity shown in the table is the weight of the dispersion that was used, including solvent.

The resulting precursor for Example 16 was imaged on a Creo TRENDSETTER 3244x at 150 mJ/cm² and then mounted directly on an ABDick press charged with Van Son Rubber Base Black ink and fountain solution containing Varn Litho Etch 142W at 3 oz./gal. and PAR alcohol replacement at 3 oz./gal. The plate sample printed 250 copies when the press was stopped. Highlight wear was observed by this point.

Example 17

Printing Plate Prepared with Copolymer 9

To an electrochemically-grained and sulfuric acid-anodized aluminum substrate that had been post-treated with PVPA, the coating composition described in Table 8 was applied. The coating composition was applied using a wire-wound rod and then dried for approximately 90 sec residence time in a Ranar conveyor oven set at 90° C., to yield a printing plate precursor. The dry coating weight obtained was 1.5 g/m².

TABLE 8

Coating composition for Example 17.

| Component | Parts by Weight |
|---|---|
| Urethane Acrylate | 2.48 |
| Copolymer 9[1] | 13.79 |
| ELVACITE 4026 | 3.31 |
| IRGACURE 250 | 0.42 |
| IR absorbing dye | 0.13 |
| Mercapto-3-triazole | 0.18 |
| BYK 336 | 0.60 |
| KLUCEL M | 3.30 |
| SARTOMER 355 | 0.33 |
| n-Propanol | 62.42 |
| Water | 13.37 |

[1]Copolymer 9 as used in coating formulations is a dispersion of 24 wt.-% solids in an 80/20 mixture of n-propanol/water. The quantity shown in the table is the weight of the dispersion that was used, including solvent.

The resulting printing plate was imaged on a Creo Trendsetter 3244x at 150 mJ/cm² and then mounted directly on an ABDick press run as previously described. The plate sample printed 250 copies when the press was stopped. No wear was observed.

Example 18

Printing Plate Prepared with Copolymer 10

To a brush-grained and phosphoric acid-anodized aluminum substrate that had been post-treated with PAA, the coating composition specified in Table 9 was applied. The coating composition was applied using a wire-wound rod and then dried for approximately 90 sec in a Ranar conveyor oven set at 90° C., to yield a printing plate precursor. The dry coating weight obtained was 1.5 g/m².

TABLE 9

Coating composition for Example 18.

| Component | Parts by Weight |
|---|---|
| Urethane Acrylate | 2.48 |
| Copolymer 10[1] | 15.74 |
| IRGACURE 250 | 0.42 |
| IR absorbing dye | 0.13 |
| Mercapto-3-triazole | 0.18 |
| BYK 336 | 0.60 |
| KLUCEL M | 3.31 |
| n-Propanol | 64.57 |
| Water | 12.57 |

[1]Copolymer 10 as used in coating formulations is a dispersion of 24 wt.-% solids in an 76/24 mixture of n-propanol/water. The quantity shown in the table is the weight of the dispersion that was used, including solvent.

The resulting precursor for Example 18 was imaged on a Creo TRENDSETTER 3244x at 300 mJ/cm² and then mounted directly on a Komori press charged with Graphics Equinox black ink, fountain solution containing Varn Litho Etch 142W at 3 oz./gal. and PAR alcohol replacement at 3 oz./gal., and a hard blanket. The print-out of the image areas for this plate were blue and easily visible while the non-image areas remained pale blue. The plate printed more than 40,000 copies of good quality prints.

While on press, image areas were treated V-120 press wash. Image areas treated with V-120 were unaffected and wore at the same rate as untreated image areas.

Comparative Example 19

A precursor was prepared as in Example 11, except that Copolymer 1 was replaced with Copolymer 3. The resulting precursor was imaged on a Creo TRENDSETTER 3244x at 250 mJ/cm² and then mounted directly on a Komori press charged with Graphics Equinox black ink, fountain solution containing Varn Litho Etch 142W at 3 oz./gal. and PAR alcohol replacement at 3 oz./gal., and a hard blanket. The print-out of the image areas for this plate were blue and easily visible while the non-image areas remained pale blue. The plate printed approximately 16,000 copies before showing wear in the solid areas.

While on press, image areas were treated independently with Aqua Image plate preserver/cleaner solution or V-120 press wash. Image areas treated with either the Aqua Image plate preserver/cleaner solution or V120 were visibly weakened and wore at a much faster rate than untreated image areas.

This invention may take on various modifications and alterations without departing from the spirit and scope thereof. Accordingly, it is to be understood that this invention is not to be limited to the above-described, but it is to be controlled by the following claims and any equivalents thereof. It is also to be understood that this invention may be suitably practiced in the absence of any element not specifically disclosed herein.

In describing preferred embodiments of the invention, specific terminology is used for the sake of clarity. The invention, however, is not intended to be limited to the specific terms so selected, and it is to be understood that each term so selected includes all technical equivalents that operate similarly.

What is claimed is:

1. An imageable element comprising:
   a lithographic substrate; and
   disposed on the substrate, an imageable layer including
   a) a radically polymerizable component;
   b) an initiator system capable of generating radicals sufficient to initiate a polymerization reaction upon exposure to imaging radiation; and
   c) a polymeric binder having a hydrophobic backbone and including each of:
      i) at least 50 weight % of constitutional units having a pendant cyano group attached directly to the hydrophobic backbone that are derived from (meth)acrylonitrile,
      ii) constitutional units having a pendant group including a hydrophilic poly(alkylene oxide) segment that are derived from poly(ethylene glycol) alkyl ether (meth)acrylate, and
      iii) constitutional units derived from one or more of styrene and substituted styrenic monomers.

2. The imageable element of claim 1, wherein the polymeric binder is a polymer derived from acrylonitrile, styrene, and poly(ethylene glycol) methyl ether methacrylate.

3. The imageable element of claim 1, wherein the polymer binder is a polymer derived from (meth)acrylonitrile, poly(ethylene glycol) alkyl ether methacrylate, and styrene.

4. The imageable element of claim 1, wherein the polymeric binder is a polymer derived from:
   about 55 to about 90 percent (meth)acrylonitrile, by weight;
   about 5 to about 15 percent poly(ethylene glycol) alkyl ether (meth)acrylate, by weight; and
   about 5 to about 30 percent styrene, by weight.

5. The imageable element of claim 1, wherein the polymeric binder is a polymer derived from a combination of monomers consisting essentially of:
   about 55 to about 90 percent (meth)acrylonitrile, by weight;
   about 5 to about 15 percent poly(ethylene glycol) alkyl ether (meth)acrylate, by weight; and
   about 5 to about 30 percent styrene, by weight.

6. The imageable element of claim 1, wherein the polymeric binder is a polymer derived from a combination of monomers consisting essentially of:
   about 55 to about 90 percent acrylonitrile, by weight;
   about 5 to about 15 percent poly(ethylene glycol) methyl ether methacrylate, by weight; and
   about 5 to about 30 percent styrene, by weight.

7. The imageable element of claim 1, wherein about 70 to about 99.9 mol-% of the total constitutional units in the polymeric binder include pendant cyano groups attached directly to the hydrophobic backbone.

8. The imageable element of claim 1, wherein the poly(ethylene oxide) segment has a molecular weight in the range from about 300 Da to about 10,000 Da.

9. The imageable element of claim 1, wherein the poly(ethylene oxide) segment has a molecular weight in the range from about 1000 Da to about 3000 Da.

10. The imageable element of claim 1, wherein the pendant group including a hydrophilic poly(ethylene oxide) segment is of the form:

wherein y is in the range from about 25 to about 75.

11. The imageable element of claim 1, wherein the polymeric binder is a polymer derived from a combination of polymerizable monomers that includes acrylamide, methacrylamide, or a combination thereof.

12. The imageable element of claim 1, wherein the polymeric binder is characterized by a number average molecular weight in the range from about 10,000 Da to about 250,000 Da.

13. The imageable element of claim 1, wherein the hydrophobic backbone is an all-carbon backbone.

14. The imageable element of claim 1, wherein the polymeric binder is present in the imageable layer in the form of discrete particles.

15. The imageable element of claim 14, wherein the particles are characterized by an average diameter in the range from about 100 nm to about 700 nm.

16. The imageable element of claim 14, wherein the particles are characterized by an average diameter in the range from about 150 nm to about 250 nm.

17. The imageable element of claim 1, wherein the imageable layer comprises about 10 wt.-% to about 70 wt.-% of the polymerizable component.

18. The imageable element of claim 1, wherein the imageable layer comprises about 20 wt.-% to about 60 wt.-% of the polymerizable component.

19. The imageable element of claim 1, wherein the imageable layer comprises about 30 wt.-% to about 50 wt.-% of the polymerizable component.

20. The imageable element of claim 1, wherein the imageable layer comprises about 10 wt.-% to about 80 wt.-% of the polymeric binder.

21. The imageable element of claim 1, wherein the imageable layer comprises about 20 wt.-% to about 50 wt.-% of the polymeric binder.

22. The imageable element of claim 1, wherein the imageable layer comprises about 30 wt.-% to about 40 wt.-% of the polymeric binder.

23. The imageable element of claim 1, wherein the lithographic substrate is a sulfuric acid-anodized aluminum sheet.

24. The imageable element of claim 1, wherein the lithographic substrate is a phosphoric acid-anodized aluminum sheet.

25. The imageable element of claim 1, wherein the initiator system is capable of generating radicals sufficient to initiate a polymerization reaction upon exposure to infrared radiation in the range from about 800 nm to about 1200 nm.

26. The imageable element of claim 1, wherein the initiator system comprises a photothermal conversion material and a radical generator.

27. The imageable element of claim 26, wherein the photothermal conversion material is an infrared-absorbing dye.

28. The imageable element of claim 26, wherein the radical generator is an onium compound, a borate compound, or a triazine compound.

29. The imageable element of claim 1, wherein the initiator system further comprises a shelf life-extending additive.

30. The imageable element of claim 29, wherein the shelf life-extending additive is a mercapto compound or an amino compound.

31. The imageable element of claim 1, wherein the imageable layer further comprises from about 1 wt.-% to about 30 wt.-% of a second binder.

32. The imageable element of claim 31, wherein the second binder provides crosslinkable ethylenically unsaturated sites.

33. An imageable element comprising:
a lithographic substrate; and
disposed on the substrate, an imageable layer including
a) a radically polymerizable component;
b) an initiator system capable of generating radicals sufficient to initiate a polymerization reaction upon exposure to imaging radiation; and
c) a polymeric binder having a hydrophobic backbone and including each of:
i) at least 50 weight % of constitutional units having a pendant cyano group attached directly to the hydrophobic backbone,
ii) constitutional units having a pendant group including a hydrophilic poly(alkylene oxide) segment, and
iii) constitutional units derived from one or more of acrylate esters, methacrylate esters, (meth)acrylic acid, allyl (meth)acrylates, (meth)acrylamides, styrene and substituted styrenic monomers, vinyl acetate, vinyl butyrate, methyl vinyl ketone, butyl vinyl ketone, vinyl fluoride, vinyl chloride, vinyl bromide, maleic anhydride, maleimide, N-phenyl maleimide, N-cyclohexyl maleimide, N-benzyl maleimide, and monomers having pendant siloxane functionality, wherein the constitutional units iii) include styrene, and styrene,
wherein the constitutional units having pendant cyano groups include constitutioal units of the form
—[CH$_2$CH(C≡N)—] or —[CH$_2$C(CH$_3$)(C≡N)—].

34. An imageable element comprising:
a lithographic substrate; and
disposed on the substrate, an imageable layer including
a) a radically polymerizable component; b) an initiator system capable of generating radicals sufficient to initiate a polymerization reaction upon exposure to imaging radiation; and
c) a polymeric binder having a hydrophobic backbone and is a random polymer consisting essentially of:
i) constitutional units of the form —[CH$_2$C(R)(C≡N)—];
ii) constitutional units of the form —[CH$_2$C(R)(PEO)—], wherein PEO represents a pendant group of the form —C(=O)O—[CH$_2$CH$_2$O—]$_y$CH$_3$, wherein y is in the range from about 25 to about 75; and
iii) constitutional units of the form:

—[CH$_2$CH(Ph)—];

wherein each R independently represents —H or —CH$_3$, and Ph represents a pendant phenyl group.

35. An imageable element comprising:
a lithographic substrate; and
disposed on the substrate, an imageable layer including
a) a radically polymerizable component;
b) an initiator system capable of generating radicals sufficient to initiate a polymerization reaction upon exposure to imaging radiation; and
c) a polymeric binder having a hydrophobic backbone and including each of:
i) at least 50 weight % of constitutional units having a pendant cyano group attached directly to the hydrophobic backbone,
ii) constitutional units having a pendant group including a hydrophilic poly(alkylene oxide) segment, and
iii) constitutional units derived from one or more acrylate esters, methacrylate esters, (meth)acrylic acid, allyl (meth)acrylates, (meth)acrylamides, styrene and substituted styrenic monomers, vinyl acetate, vinyl butyrate, methyl vinyl ketone, butyl vinyl ketone, vinyl fluoride, vinyl chloride, vinyl bromide, maleic anhydride, maleimide, N-phenyl maleimide, N-cyclohexyl maleimide, N-benzyl maleimide, and monomers having pendant siloxane functionality, wherein the polymerizable component includes a urethane acrylate compound.

36. In an imageable element having an imageable layer including:
   a radically polymerizable component;
   an initiator system capable of generating radicals sufficient to initiate a polymerization reaction upon exposure to infrared radiation; and
   one or more polymeric binders; the improvement comprising:
   as a polymeric binder, a polymer derived from a combination of monomers including:
      about 55 to about 90 percent (meth)acrylonitrile, by weight;
      about 5 to about 15 percent poly(ethylene glycol) alkyl ether (meth)acrylate, by weight; and
      about 5 to about 30 percent styrene, by weight.

37. The imageable element of claim 36, wherein the polymer is derived from a combination of monomers consisting essentially of (meth)acrylonitrile, poly(ethylene glycol) alkyl ether (meth)acrylate, and styrene.

38. The imageable element of claim 36, wherein the polymer is derived from a combination of monomers consisting essentially of acrylonitrile, poly(ethylene glycol) methyl ether methacrylate, and styrene.

39. In an imageable element having an imageable layer including:
   a radically polymerizable component;
   an initiator system capable of generating radicals sufficient to initiate a polymerization reaction upon exposure to infrared radiation; and
   one or more polymeric binders; the improvement comprising:
   as a polymeric binder, a random polymer consisting essentially of:
      i) constitutional units of the form $-[CH_2C(R)(C\equiv N)-]$;
      ii) constitutional units of the form $-[CH_2C(R)(PEO)-]$, wherein PEO represents a pendant group of the form
         $-C(=O)O-[CH_2CH_2O-]_yCH_3$,
         wherein y is in the range from about 25 to about 75; and
      iii) constitutional units of the form:
         $-[CH_2CH(Ph)-]$;
   wherein each R independently represents $-H$ or $-CH_3$, and Ph represents a pendant phenyl group.

40. The imageable element of claim 39, wherein
   about 70 to about 99.9 mol-% of the total constitutional units in the random polymer are of the form $-[CH_2C(R)(C\equiv N)-]$;
   about 0.1 to about 5 mol-% of the total constitutional units in the random polymer are constitutional units of the form $-[CH_2C(R)(PEO)-]$; and
   about 2 to about 20 mol-% of the total constitutional units in the random polymer are of the form $-[CH_2CH(Ph)-]$.

41. A method for making a printing plate, comprising the steps of:
   providing an imageable element comprising:
      a lithographic substrate; and
      disposed on the substrate, an imageable layer including
      a) a radically polymerizable component;
      b) an initiator system capable of generating radicals sufficient to initiate a polymerization reaction upon exposure to imaging radiation; and
      c) a polymeric binder having a hydrophobic backbone and including each of:
         i) at least 50 weight % of constitutional units having a pendant cyano group attached directly to the hydrophobic backbone that are derived from (meth)acrylonitrile,
         ii) constitutional units having a pendant group including a hydrophilic poly(alkylene oxide) segment that are derived from poly(ethylene glycol) alkyl ether (meth)acrylate, and
         iii) constitutional units derived from one or more of styrene and substituted styrenic monomers,
   imagewise exposing the element to imaging radiation;
   mounting the element on a lithographic printing press; and
   developing the element by contacting the element with ink and/or fountain solution, to yield the printing plate.

42. The method of claim 41, wherein the step of mounting the element on a lithographic printing press is done prior to the step of imagewise exposing the element.

43. The method of claim 41, wherein the step of mounting the element on a lithographic printing press is done prior to the step of developing the element.

* * * * *

UNITED STATES PATENT AND TRADEMARK OFFICE
CERTIFICATE OF CORRECTION

| | | |
|---|---|---|
| PATENT NO. | : 7,261,998 B2 | Page 1 of 1 |
| APPLICATION NO. | : 10/872209 | |
| DATED | : August 28, 2007 | |
| INVENTOR(S) | : Kouji Hayashi et al. | |

It is certified that error appears in the above-identified patent and that said Letters Patent is hereby corrected as shown below:

Col. 28, Claim 33, line 17   In Claim 33, after "and" delete "styrene,".
Col. 28, Claim 33, line 19   In Claim 33, delete "constitutioal" and insert
                             -- constitutional --, therefor.
Col. 29, Claim 36, line 9    In Claim 36, after "polymer" insert -- that provides
                             on-press solvent resistance after imaging and is --.
Col. 29, Claim 39, line 32   In Claim 39, after "polymer" delete "consisting" and
                             insert -- that provides on-press solvent resistance after
                             imaging and consists --.

Signed and Sealed this

Twentieth Day of May, 2008

JON W. DUDAS
*Director of the United States Patent and Trademark Office*